(12) United States Patent
Liu

(10) Patent No.: US 7,418,251 B2
(45) Date of Patent: Aug. 26, 2008

(54) COMPACT RADIO FREQUENCY HARMONIC FILTER USING INTEGRATED PASSIVE DEVICE TECHNOLOGY

(75) Inventor: Lianjun Liu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 602 days.

(21) Appl. No.: 11/021,295

(22) Filed: Dec. 23, 2004

(65) Prior Publication Data
US 2006/0141978 A1 Jun. 29, 2006

(51) Int. Cl.
*H04B 1/28* (2006.01)

(52) U.S. Cl. .................... 455/333; 455/307; 455/114.1; 333/175; 333/176

(58) Field of Classification Search ................. 455/333, 455/307, 339, 424, 425, 456.5, 456.6, 63.1, 455/550.5, 575.1, 561, 114.1, 114.2, 278.1, 455/296, 295, 306, 289, 291, 292, 293, 302, 455/252.1; 336/200, 83, 192, 206–208, 232, 336/223; 333/185, 175, 186, 181, 12, 183, 333/184, 204; 327/551, 558
See application file for complete search history.

(56) References Cited

U.S. PATENT DOCUMENTS

| | | | |
|---|---|---|---|
| 4,881,050 A * | 11/1989 | Swanson, Jr. ............... | 333/185 |
| 5,032,810 A * | 7/1991 | Kaneko et al. .............. | 333/185 |
| 5,173,671 A * | 12/1992 | Wendler et al. ............. | 333/185 |
| 5,576,672 A * | 11/1996 | Hirai et al. .................. | 333/204 |
| 5,697,087 A * | 12/1997 | Miya et al. .................. | 455/307 |
| 6,094,112 A * | 7/2000 | Goldberger et al. ......... | 333/185 |
| 6,448,873 B1 * | 9/2002 | Mostov ....................... | 333/185 |
| 6,522,217 B1 * | 2/2003 | Shen ........................ | 333/99 S |
| 6,529,102 B2 * | 3/2003 | Masuda et al. .............. | 333/177 |
| 7,071,797 B2 * | 7/2006 | Ye .............................. | 333/204 |
| 7,084,720 B2 * | 8/2006 | Gomez et al. ............... | 333/204 |
| 7,098,759 B2 * | 8/2006 | Chang ......................... | 333/204 |
| 2002/0127973 A1 * | 9/2002 | Furutani et al. ............. | 455/82 |
| 2003/0128085 A1 * | 7/2003 | Gomez et al. ............... | 333/204 |
| 2004/0041668 A1 * | 3/2004 | Mikami et al. ............. | 333/204 |

FOREIGN PATENT DOCUMENTS

JP 2004-023335 * 1/2004

* cited by examiner

*Primary Examiner*—Edward Urban
*Assistant Examiner*—Charles Chow
(74) *Attorney, Agent, or Firm*—Ingrassia, Fisher & Lorenz, P.C.

(57) ABSTRACT

A radio frequency ("RF") harmonic filter circuit as disclosed herein is fabricated using integrated passive device ("IPD") technology. The RF harmonic filter circuit is configured to provide second, third, and fourth harmonic rejection while providing good input and output impedance matching. The RF harmonic filter circuit employs only one IPD loop inductance (preferably used for a second harmonic resonance circuit), which results in a significant die/package size reduction. The RF harmonic filter circuit also employs a combined circuit that performs input and/or output impedance matching and third harmonic rejection.

22 Claims, 6 Drawing Sheets

COMPACT RADIO FREQUENCY HARMONIC FILTER USING INTEGRATED PASSIVE DEVICE TECHNOLOGY

TECHNICAL FIELD

The present invention relates generally to electronic components. More particularly, the present invention relates to radio frequency ("RF") harmonic filters fabricated using integrated passive device ("IPD") technology.

BACKGROUND

The prior art is replete with electronic devices and components designed for high frequency data communication applications. A common practical application for such devices and components is cellular telephony systems. In this regard, the need for component integration will increase as module sizes decrease for high performance cellular phones with advanced features. Cellular phone radio transmitters use several passive components for functions such as filtering, impedance matching, and switching. For example, a harmonic filter is used for signal selectivity over radio bands, such as the 824-915 MHz AMPS/GSM band or the 1.71-1.91 GHz DCS/PCS band. Practical harmonic filters for use in these bands are specifically designed to reject the second, third, and fourth harmonic frequencies from an RF input signal.

In conventional IPD implementations, an RF harmonic filter includes at least two loop inductors, which represent the bulk of the physical space of the device, which is typically on the order of approximately 1 mm$^2$. In addition, conventional RF harmonic filter designs employ distinct input impedance matching and output impedance matching circuit elements, which inherently contribute to the overall size of the device. In accordance with the current trend toward miniaturization, a smaller device footprint is desirable, especially if such a smaller footprint can be achieved without a significant increase in manufacturing cost or complexity.

Accordingly, it is desirable to have a compact, low cost, RF harmonic filter that can be fabricated as an IPD. Furthermore, other desirable features and characteristics of the present invention will become apparent from the subsequent detailed description and the appended claims, taken in conjunction with the accompanying drawings and the foregoing technical field and background.

BRIEF SUMMARY

An RF harmonic filter device configured in accordance with an embodiment of the invention is implemented as an IPD using only one IPD loop inductor. The RF harmonic filter employs at least one circuit that functions as a combined harmonic resonance and impedance matching circuit. The elimination of an IPD loop inductor results in a reduction in the footprint of the device, thus reducing the overall size and packaging requirements of the RF harmonic filter device.

The above and other aspects of the invention may be carried out in one form by an RF harmonic filter circuit fabricated using IPD. The RF harmonic filter circuit includes a substrate, only one IPD loop inductance formed on the substrate, and a harmonic resonance circuit formed on the substrate, where the harmonic resonance circuit includes the IPD loop inductance.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or schematic components. It should be appreciated that such components may be realized in any number of practical ways. For example, an embodiment of the invention may employ various elements, e.g., conductive traces, wire bonds, integrated passive devices, semiconductor substrate materials, dielectric materials, or the like, which may have characteristics or properties known to those skilled in the art. In addition, those skilled in the art will appreciate that the present invention may be practiced in conjunction with any number of practical RF circuit topologies and applications and that the harmonic filter circuits described herein are merely example applications for the invention.

For the sake of brevity, conventional techniques related to RF circuit design, RF signal propagation, RF impedance matching, semiconductor process technology, integrated passive device fabrication, and other aspects of the circuits (and the individual operating components of the circuits) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

The following description refers to elements or features being "connected" together. As used herein, unless expressly stated otherwise, "connected" means that one element/feature is directly or indirectly connected to another element/feature, and not necessarily mechanically. For example, although the various schematics depict example arrangements of elements, additional intervening elements, devices, features, or components may be present in actual embodiments (assuming that the functionality of the circuits are not adversely affected).

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

Figure 1:
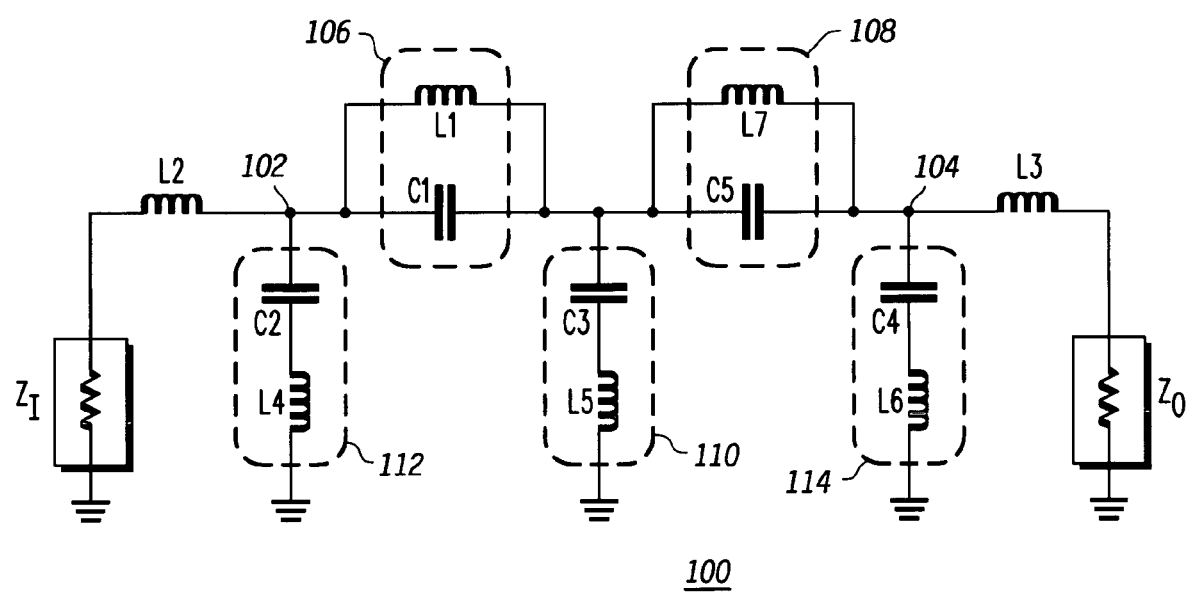
FIG. 1 is a schematic diagram of a prior art harmonic filter circuit topology.
Figure 2:
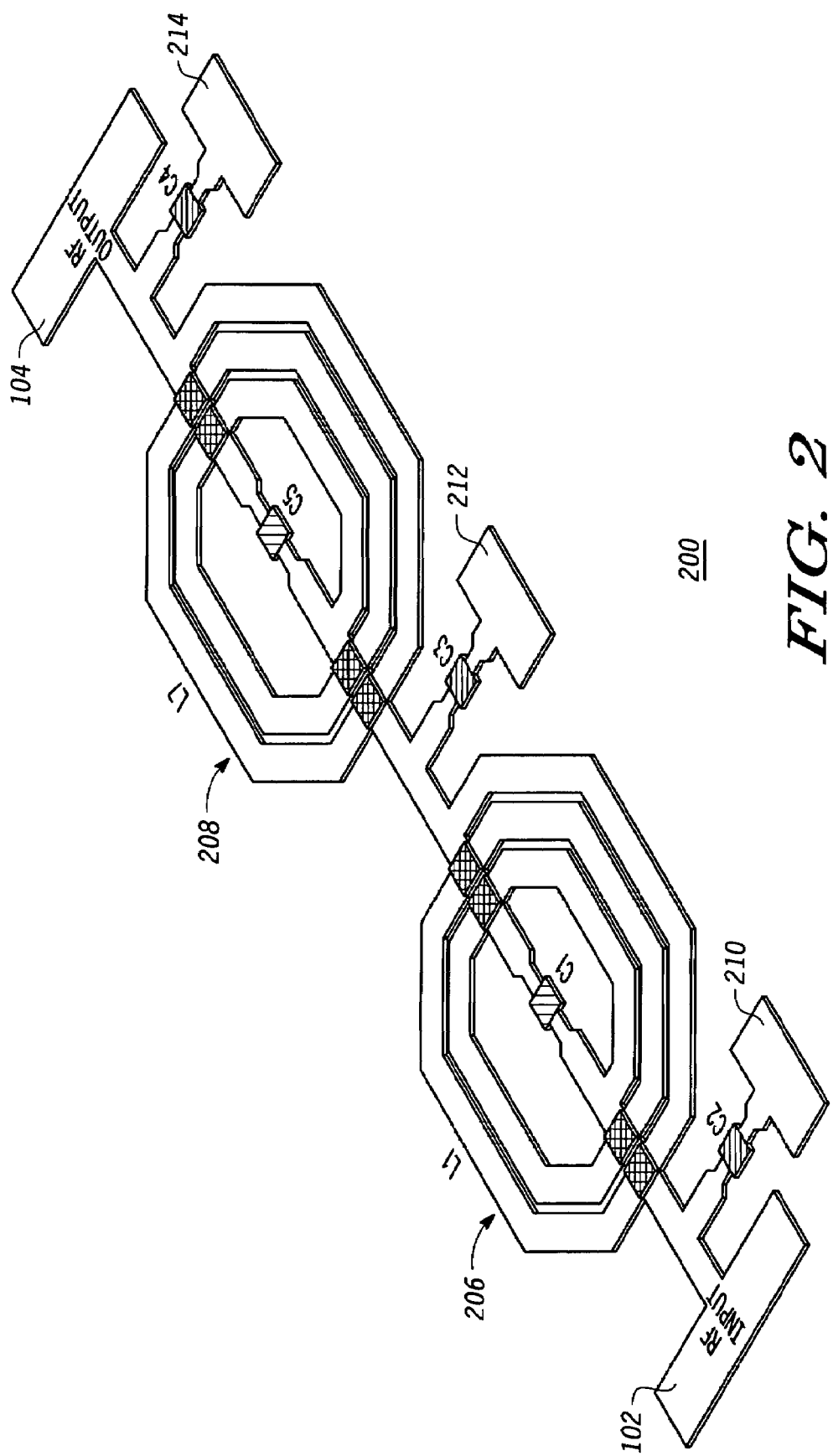
FIG. 2 is a perspective view of an example device layout for a high band harmonic filter having the topology shown in FIG. 1.
Figure 3:
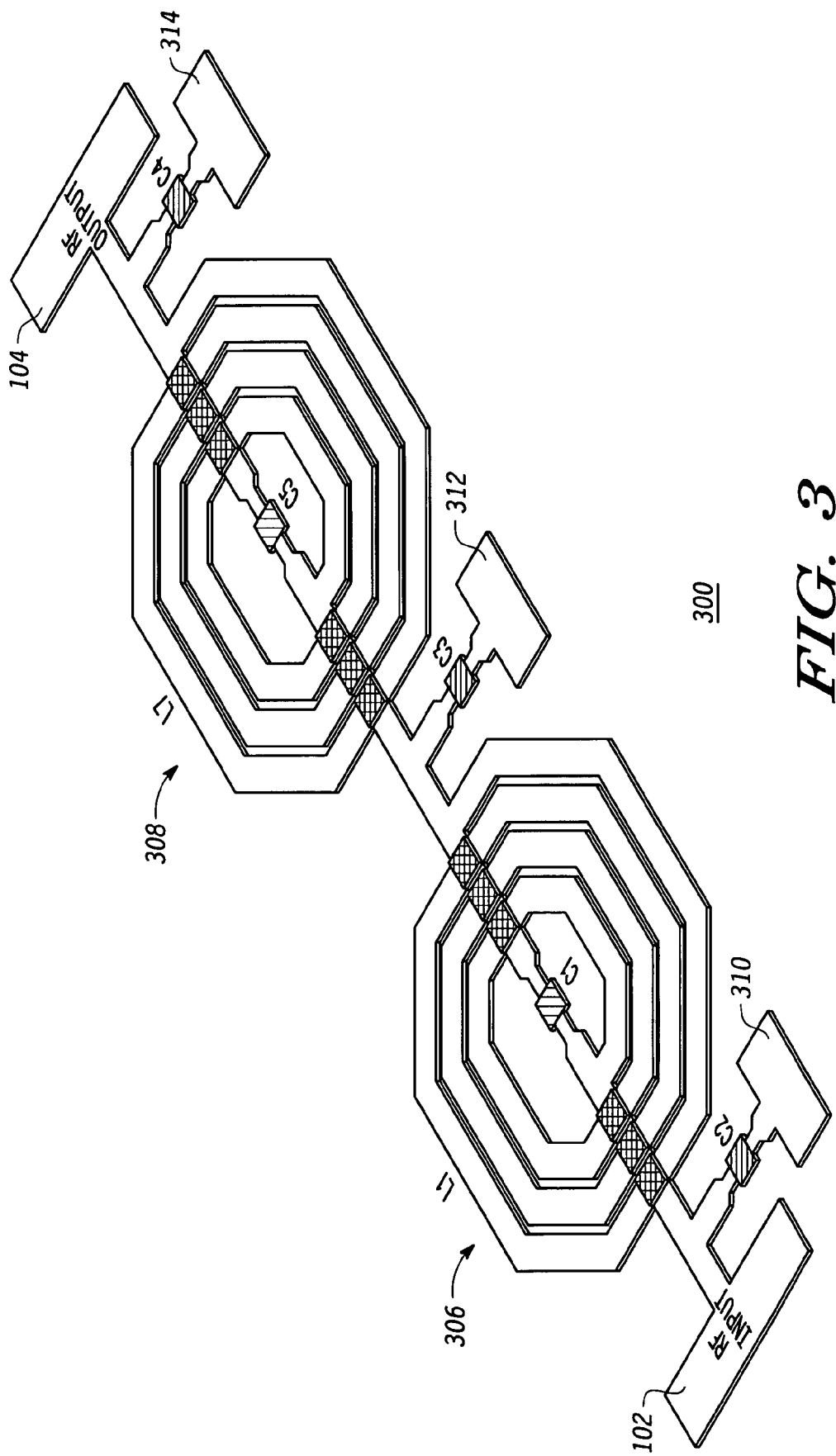
FIG. 3 is a perspective view of an example device layout for a low band harmonic filter having the topology shown in FIG. 1.

FIG. 1 is a schematic diagram showing the general circuit topology of an RF harmonic filter 100, FIG. 2 is a perspective view of an example IPD layout for a high band RF harmonic filter 200 having the circuit topology shown in FIG. 1, and FIG. 3 is a perspective view of an example IPD layout for a low band RF harmonic filter 300 having the circuit topology shown in FIG. 1. RF harmonic filters 100/200/300 share a number of features and, where applicable, the following description of common features is intended to apply to RF harmonic filters 100/200/300 individually and collectively.

An RF signal enters harmonic filter 100 at an input port 102 (corresponding to a conductive RF input pad), and a filtered RF signal within the desired RF band is provided at an output port 104 (corresponding to a conductive RF output pad). In the practical layouts shown in FIG. 2 and FIG. 3, the RF energy propagates over conductive traces formed on an insulating (semiconducting) substrate. Harmonic content associated with the RF input signal is rejected by three harmonic resonance circuits: a second harmonic resonance circuit 106/206/306; a third harmonic resonance circuit 108/208/308; and a fourth harmonic resonance circuit 110. Second harmonic resonance circuit 106/206/306 is realized as an LC tank circuit (inductor L1 in parallel with capacitor C1), third harmonic resonance circuit 108/208/308 is realized as an LC tank circuit (inductor L7 in parallel with capacitor C5), and fourth harmonic resonance circuit 110 is realized as an LC series combination (capacitor C3 in series with inductor L5). Harmonic filter 100 also includes an input impedance matching circuit 112 and an output impedance matching circuit 114. Input impedance matching circuit 112 is realized as an LC series combination (capacitor C2 in series with inductor L4), and output impedance matching circuit 114 is realized as an LC series combination (capacitor C4 in series with inductor L6). The specific inductor and capacitor values of the harmonic filters are selected according to the desired filtering characteristics and the desired output frequency band. For example, harmonic filter 300 may be suitably configured for operation with AMPS/GSM applications (824-915 MHz), while harmonic filter 200 may be suitably configured for operation with DCS/PCS applications (1710-1910 MHz).

In practice, IPDs can be used to effectively reduce component and module sizes. As used herein, an IPD is a passive electronic device or a passive electronic component that can be fabricated using semiconductor process technology. An IPD can be produced with very high precision, excellent reproducibility, and low cost in high quantities by utilizing semiconductor wafer processing technologies. The layouts of harmonic filter 200 and harmonic filter 300 represent IPD realizations, where all of the depicted elements are formed on the same substrate (e.g., a semiconductor or insulating substrate such as GaAs, glass, or ceramic) using the same semiconductor process technology (i.e., the fabrication or manufacturing process by which the IPD is formed). In harmonic filters 200/300, inductors L1 and L7 are realized as conductive RF signal line loops (bridges are employed at the respective "intersections" of each inductor to insulate the inductor loops from the respective C1 and C5 transmission lines), and the C1, C2, C3, C4, and C5 capacitors are formed as IPDs on the substrate in the desired locations. The L1 and L7 inductors in harmonic filter 200 are smaller in size, include less loops, and have lower inductances than the L1 and L7 inductors in harmonic filter 300. Notably, inductors L4, L5, and L6 (not shown in FIGS. 2 and 3) are realized as wire bonds or other inductance elements connected between respective contact pads (numbered 210, 212, and 214 in FIG. 2; numbered 310, 312, and 314 in FIG. 3) and ground pads, which may be off-chip. Thus, inductors L4, L5, and L6 are not actually part of the IPD itself, and harmonic filters 100/200/300 may be referred to as "two inductor" IPDs.

Figure 4:
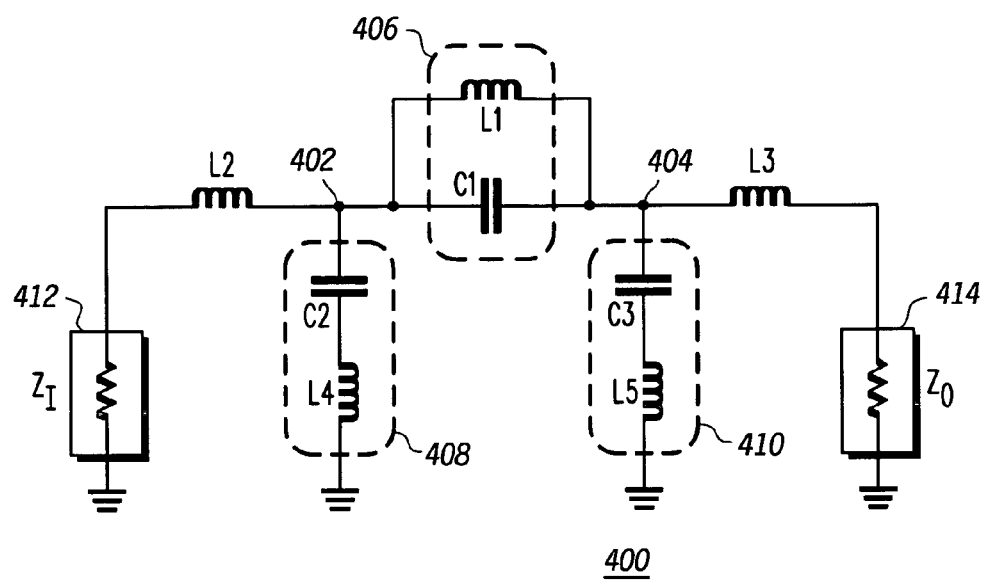
FIG. 4 is a schematic diagram of a high band harmonic filter circuit topology according to an example embodiment of the invention.
Figure 5:
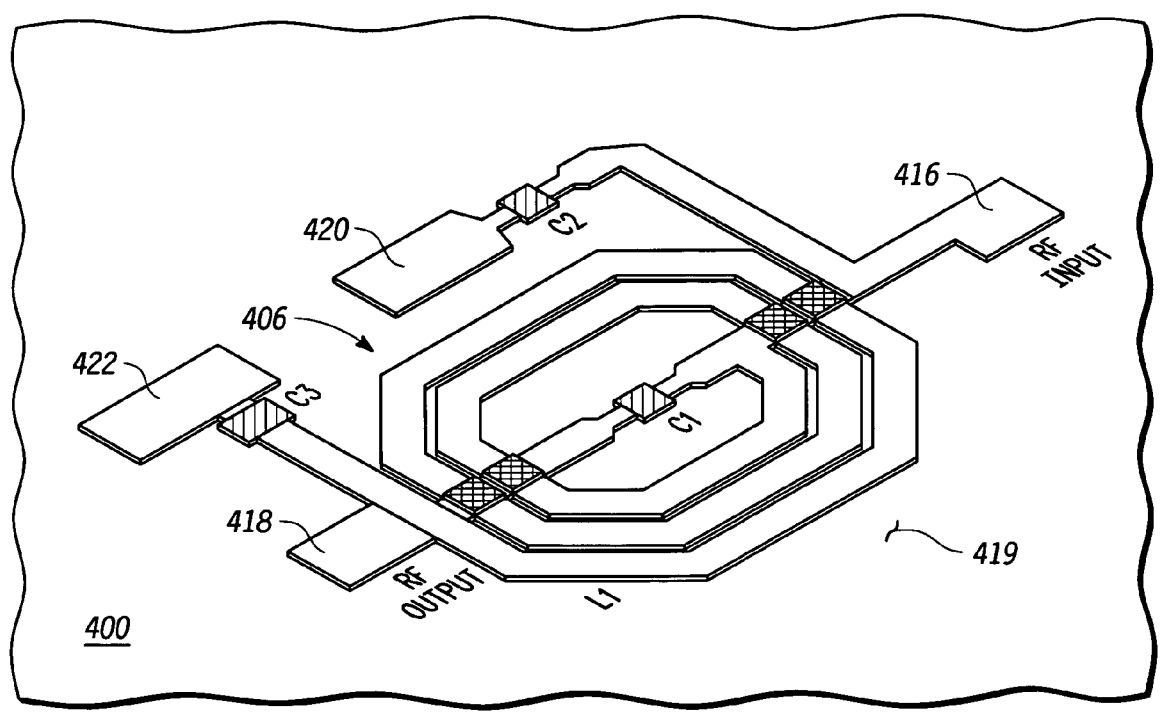
FIG. 5 is a perspective view of an example device layout for a high band harmonic filter having the topology shown in FIG. 4.

FIG. 4 is a schematic circuit diagram of a high band RF harmonic filter 400 configured in accordance with an embodiment of the invention, and FIG. 5 is a perspective view of an example IPD layout for RF harmonic filter 400. Referring to FIG. 4, harmonic filter 400 generally includes an RF input node 402, an RF output node 404, a second harmonic resonance circuit 406 connected between RF input node 402 and RF output node 404, a combined third harmonic resonance and input matching circuit 408 connected to RF input node 402, and a combined fourth harmonic resonance and output matching circuit 410 connected to RF output node 404. In operation, RF input node 402 may be connected, via an inductance L2, to a component, device, circuit, or termination 412 that provides an input impedance (typically 50 ohms) for harmonic filter 400, and RF output node 404 may be connected, via an inductance L3, to a component, device, circuit, or termination 414 that provides an output impedance (typically 50 ohms) for harmonic filter 400.

Second harmonic resonance circuit 406 includes an inductor L1 connected in parallel with a capacitor C1, where inductor L1 and capacitor C1 are each connected between RF input node 402 and RF output node 404. Second harmonic resonance circuit 406 is suitably configured to reject the second harmonic component of the RF input signal. Combined third harmonic resonance and input matching circuit 408 includes a capacitor C2 connected in series with an inductor L4. As shown in FIG. 4, combined third harmonic resonance and input matching circuit 408 is connected between RF input node 402 and ground. Combined third harmonic and input matching circuit 408 is suitably configured to reject the third harmonic component of the RF input signal while establishing a desired input impedance for harmonic filter 400. Combined fourth harmonic resonance and output matching circuit 410 includes a capacitor C3 connected in series with an inductor L5. As shown in FIG. 4, combined fourth harmonic resonance and output matching circuit 410 is connected between RF output node 404 and ground. Combined fourth harmonic and output matching circuit 410 is suitably configured to reject the fourth harmonic component of the RF input signal while establishing a desired output impedance for harmonic filter 400.

In an alternate embodiment, harmonic filter 400 may employ a combined fourth harmonic resonance and input matching circuit (in lieu of combined third harmonic resonance and input matching circuit 408), and a combined third harmonic resonance and output matching circuit (in lieu of combined fourth harmonic resonance and output matching circuit 410). Of course, such an alternate embodiment would require appropriate design and optimization to accommodate the combined functions. Furthermore, although the preferred embodiment maintains the position of the second harmonic resonance circuit as shown in FIG. 4, an alternate embodiment may utilize that position for the third or fourth harmonic resonance circuit, with the second harmonic resonance circuit being combined with the input or output matching circuit as described herein.

Referring to FIG. 5, an RF signal enters harmonic filter 400 at an RF input pad 416 (which corresponds to RF input node 402 in FIG. 4), and a filtered RF signal within the desired RF band is provided at an RF output pad 418 (which corresponds to RF output node 404 in FIG. 4). In the practical layout shown in FIG. 5, the RF energy propagates over conductive traces formed on an insulating (semiconducting) substrate 419. The IPD layout shown in FIG. 5 depicts elements formed on the same substrate 419 (e.g., a semiconductor or insulating substrate such as GaAs, glass, or ceramic) using the same semiconductor process technology (i.e., the fabrication or manufacturing process by which the IPD is formed). In this regard, inductor L1 is realized as a conductive RF signal line loop inductor (air or dielectric bridges are employed at the respective "intersections" of inductor L1 to insulate the inductor loops from the transmission lines utilized for the C1 capacitor).

In practice, the C1, C2, and C3 capacitors are each realized as an IPD capacitance formed on substrate 419 in the desired locations. IPD capacitance C1 is connected between RF input pad 416 and RF output pad 418 (in the example embodiment, inductance L1 forms bridges over the transmission line associated with IPD capacitance C1). In this regard, the input end of capacitor C1 corresponds to its RF input node and the output end of capacitor C1 corresponds to its RF output node. IPD inductance L1 is also connected between RF input pad 416 and RF output pad 418. Thus, IPD capacitance C1 is connected in parallel with IPD inductance L1. IPD capacitance C2 is connected between RF input pad 416 and a ground pad 420, and IPD capacitance C3 is connected between RF output pad 418 and a ground pad 422.

Notably, inductors L4 and L5 (not shown in FIG. 5) are realized as wire bonds, conductive traces, or other inductance elements connected between respective ground pads 420/422 and grounding pads or other ground potential locations, which may be off-chip. In other words, these inductance elements establish ground connections to ground pads 420/422. Thus, inductors L2, L3, L4, and L5 need not actually be part of the IPD substrate itself, and harmonic filter 400 may be referred to as a "single inductor" IPD. In practical embodiments, harmonic filter 400 includes only one IPD loop inductor. As mentioned above, IPD capacitance C2 and the L4 inductance element connected to ground pad 420 form the combined third harmonic resonance and input matching circuit, which is connected to RF input pad 416, while IPD capacitance C3 and the L5 inductance element connected to ground pad 422 form the combined fourth harmonic resonance and output matching circuit, which is connected to RF output pad 418.

In accordance with one practical embodiment of harmonic filter 400, IPD inductance L1, IPD capacitance C1, IPD capacitance C2, IPD capacitance C3, the L4 inductance element, and the L5 inductance element are suitably configured to provide a filter response that rejects harmonic frequencies corresponding to a pass band of 1.71 GHz to 1.91 GHz. To accomplish this objective, the input and output matching circuit component values are tuned to make the combined circuits resonate at the desired third and fourth harmonic frequencies while still providing good input and output impedance matching. Typical component values for such an example embodiment are contained in Table 1.

TABLE 1

Typical Component Values for High Band Harmonic Filter

| L1 | 3.0 nH |
|----|--------|
| L2 | 0.7 nH |
| L3 | 0.7 nH |
| L4 | 0.35 nH |
| L5 | 0.35 nH |
| C1 | 0.45 pF |
| C2 | 1.4 pF |
| C3 | 1.5 pF |
| Zi | 50 Ω |
| Zo | 50 Ω |

In accordance with known semiconductor fabrication techniques, harmonic filter 400, including IPD inductance L1, IPD capacitances C1, C2, and C3, RF input pad 416, RF output pad 418, ground pads 420/422, and other elements shown in FIG. 5 may be formed on a common semiconductor substrate 419 using a plurality of metal layers and a number of dielectric layers. The metal layers are deposited and the desired conductive traces are etched or otherwise formed from the metal layers. The metal layers are typically referred to as "metal 1," "metal 2," "metal 3," and so on to indicate the order in which they are deposited or formed onto the substrate during the fabrication process. In accordance with one practical embodiment, at least portions of the IPD capacitances are formed from the metal 2 layer and the loops of IPD inductance L1 are formed from the metal 3 layer. In accordance with one practical semiconductor process technology, metal 1 elements are approximately 0.6 μm to 2.0 μm thick; metal 2 elements are approximately 2.5 μm thick, and metal 3 elements are approximately 10 μm thick.

Figure 6:
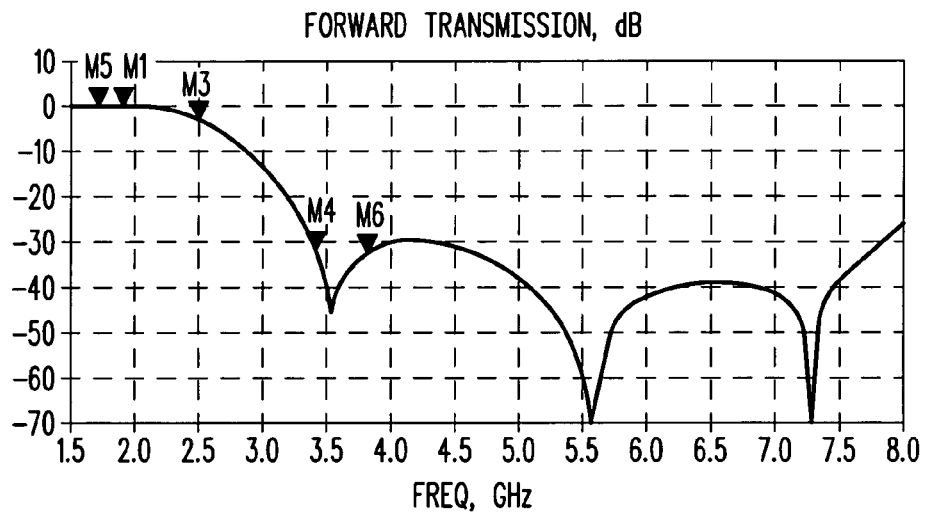
FIG. 6 is a graph showing simulated insertion loss characteristics for the high band harmonic filter shown in FIG. 5.

Harmonic filter 400 can be fabricated using IPD process technology in a manner that results in a smaller footprint relative to harmonic filter 200 shown in FIG. 2. Notably, harmonic filter 400 eliminates one of the two IPD loop inductors employed by harmonic filter 200, eliminates one of the LC tank circuits employed by harmonic filter 200, combines an input matching circuit functionality with a harmonic resonance circuit functionality, and combines an output matching circuit functionality with a harmonic resonance circuit functionality. Even though the overall die size is considerably smaller, the operation of harmonic filter 400 does not suffer. In this regard, FIG. 6 is a graph showing simulated insertion loss ($S_{21}$) characteristics for harmonic filter 400. FIG. 6 illustrates the frequency rejection at the second, third, and fourth harmonics.

Figure 7:
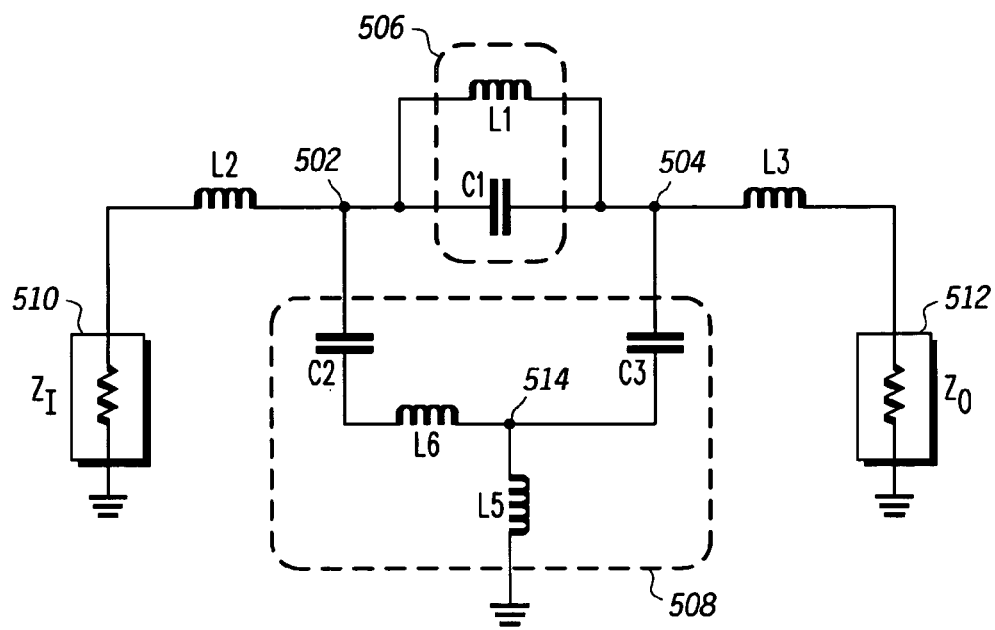
FIG. 7 is a schematic diagram of a low band harmonic filter circuit topology according to an example embodiment of the invention.
Figure 8:
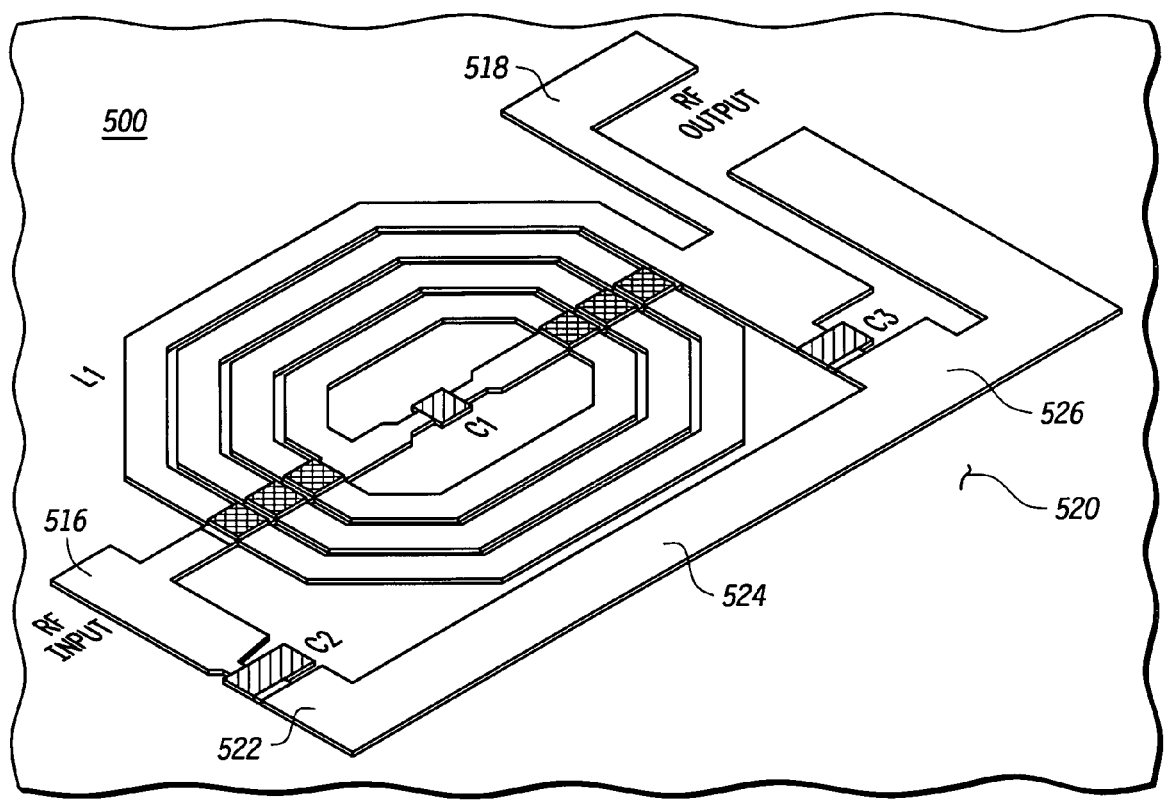
FIG. 8 is a perspective view of an example device layout for a low band harmonic filter having the topology shown in FIG. 7.

FIG. 7 is a schematic circuit diagram of a low band RF harmonic filter 500 configured in accordance with an embodiment of the invention, and FIG. 8 is a perspective view of an example IPD layout for RF harmonic filter 500. Referring to FIG. 7, harmonic filter 500 generally includes an RF input node 502, an RF output node 504, a second harmonic resonance circuit 506 connected between RF input node 502 and RF output node 504, and a combined third harmonic resonance, input matching, and output matching circuit 508 connected between RF input node 502 and RF output node 504 (circuit 508 is also connected to ground at one node). In accordance with a practical embodiment, the combined circuit may also be configured to function as a fourth harmonic resonance circuit. In operation, RF input node 502 may be connected, via an inductance L2, to a component, device, circuit, or termination 510 that provides an input impedance (typically 50 ohms) for harmonic filter 500, and RF output node 504 may be connected, via an inductance L3, to a component, device, circuit, or termination 512 that provides an output impedance (typically 50 ohms) for harmonic filter 500.

Second harmonic resonance circuit 506 includes an inductor L1 connected in parallel with a capacitor C1, where inductor L1 and capacitor C1 are each connected between RF input node 502 and RF output node 504. Second harmonic resonance circuit 506 is suitably configured to reject the second harmonic component of the RF input signal. Combined third harmonic resonance, input matching, and output matching circuit 508 includes a capacitor C2 connected at one end to RF input node 502 and connected at the other end to an inductor L6. The other end of inductor L6 is connected to a node 514. In other words, the C2/L6 series combination is connected between RF input node 502 and node 514. Combined third harmonic resonance, input matching, and output matching circuit 508 also includes a capacitor C3 connected between RF output node 504 and node 514, and an inductor L5 connected between node 514 and ground. Combined third harmonic resonance, input matching, and output matching circuit 508 is suitably configured to reject the third harmonic component of the RF input signal while establishing a desired input impedance and a desired output impedance for harmonic filter 500. Optionally (or inherently), combined third harmonic resonance, input matching, and output matching circuit 508 may also perform rejection of the fourth harmonic component of the RF input signal.

Although the preferred embodiment maintains the position of the second harmonic resonance circuit as shown in FIG. 7, an alternate embodiment may utilize that position for the third or fourth harmonic resonance circuit, with the second harmonic resonance circuit being combined with the input/output matching circuit as described herein. Furthermore, the L6 inductance need not be located as shown in FIG. 7. For example, the L6 inductance may be located in series with the C3 capacitor, the L6 inductance may be "divided" into two or more inductors, or the like.

Referring to FIG. 8, an RF signal enters harmonic filter 500 at an RF input pad 516 (which corresponds to RF input node 502 in FIG. 7), and a filtered RF signal within the desired RF band is provided at an RF output pad 518 (which corresponds to RF output node 504 in FIG. 7). In the practical layout shown in FIG. 8, the RF energy propagates over conductive traces formed on an insulating (semiconducting) substrate 520. The IPD layout shown in FIG. 8 depicts elements formed on the same substrate 520 (e.g., a semiconductor or insulating substrate such as GaAs, glass, or ceramic) using the same semiconductor process technology (i.e., the fabrication or manufacturing process by which the IPD is formed). In this regard, inductor L1 is realized as a conductive RF signal line loop inductor (air or dielectric bridges are employed at the respective "intersections" of inductor L1 to insulate the inductor loops from the transmission lines utilized for the C1 capacitor).

In practice, the C1, C2, and C3 capacitors are each realized as an IPD capacitance formed on substrate 520 in the desired locations. IPD capacitance C1 is connected between RF input pad 516 and RF output pad 518 (in the example embodiment, inductance L1 forms bridges over the transmission line associated with IPD capacitance C1). IPD inductance L1 is also connected between RF input pad 516 and RF output pad 518. Thus, IPD capacitance C1 is connected in parallel with IPD inductance L1. IPD capacitance C2 is connected between RF input pad 516 and a ground pad 522 (which may be realized as a portion of a conductive trace 524), and IPD capacitance C3 is connected between RF output pad 518 and a ground pad 526 (which may be realized as a portion of a conductive trace 524). In the example embodiment shown in FIG. 8, ground pad 522 and ground pad 526 are connected together, and integrated with, conductive trace 524. Conductive trace 524 functions as another IPD inductance (corresponding to inductance L6 in FIG. 7) for harmonic filter 500. This second IPD inductance is connected between the "ground" ends of IPD capacitance C2 and IPD capacitance C3. As shown in FIG. 8, conductive trace 524 may be configured as a non-looped inductor, in contrast to IPD inductance L1.

Notably, inductor L5 (not shown in FIG. 8) is realized as a wire bond, conductive trace, or other inductance element connected between ground pads 526 (or any suitable area of conductive trace 524) and a grounding pad or other ground potential location, which may be off-chip. In other words, this inductance element establishes a ground connection to ground pad 526 and, in turn, to IPD capacitance C3. Furthermore, the small amount of inductance needed for inductor L6 can be realized with conductive trace 524 connected between IPD capacitances C2 and C3, rather than a loop inductor. Thus, inductors L2, L3, and L5 need not be part of the IPD substrate itself, and harmonic filter 500 may be referred to as a "single inductor" IPD. In practical embodiments, harmonic filter 500 includes only one IPD loop inductor. As mentioned above, IPD capacitance C2, IPD capacitance C3, IPD inductance L6, and the L5 inductance element connected to ground pad 526 form the combined third harmonic resonance, fourth harmonic resonance, input matching, and output matching circuit 508, which is connected between RF input pad 516 and RF output pad 518.

In accordance with one practical embodiment of harmonic filter 500, IPD inductance L1, IPD capacitance C1, IPD capacitance C2, IPD capacitance C3, IPD inductance L6, and the L5 inductance element are suitably configured to provide a filter response that rejects harmonic frequencies corresponding to a pass band of 824 MHz to 915 MHz. To accomplish this objective, the matching circuit component values are tuned to make the combined circuit resonate at the desired third harmonic frequency, while still providing good input and output impedance matching. In practice, tuning for resonance at the third harmonic frequency will also provide some rejection at the fourth harmonic frequency. Typical component values for such an example embodiment are contained in Table 2.

TABLE 2

| Typical Component Values for Low Band Harmonic Filter | |
|---|---|
| L1 | 6.0 nH |
| L2 | 0.7 nH |
| L3 | 0.7 nH |
| L5 | 0.1 nH |
| L6 | 0.6 nH |
| C1 | 1.4 pF |
| C2 | 3.0 pF |
| C3 | 3.3 pF |
| Zi | 50 Ω |
| Zo | 50 Ω |

Figure 9:
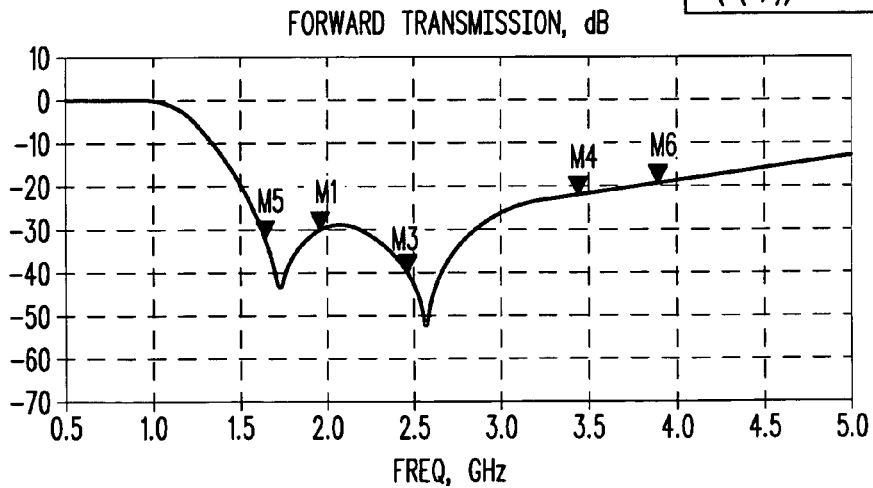
FIG. 9 is a graph showing simulated insertion loss characteristics for the low band harmonic filter shown in FIG. 8.

Harmonic filter 500 can be fabricated using IPD process technology in a manner described above, which results in a smaller footprint relative to harmonic filter 300 shown in FIG. 3. Notably, harmonic filter 500 eliminates one of the two IPD loop inductors employed by harmonic filter 300, eliminates one of the LC tank circuits employed by harmonic filter 300, and combines the functionality of an input matching circuit, a harmonic resonance circuit, and an output matching circuit into a single sub-circuit. Even though the overall die size is considerably smaller, the operation of harmonic filter 500 does not suffer. In this regard, FIG. 9 is a graph showing simulated insertion loss ($S_{21}$) characteristics for harmonic filter 500. FIG. 9 illustrates the frequency rejection at the second, third, and fourth harmonics.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A radio frequency RF harmonic filter circuit fabricated using integrated passive device IPD process technology, said RF harmonic filter circuit comprising:
    a semiconductor circuit substrate; a conductive RF input pad formed on said semiconductor circuit substrate; a conductive RF output pad formed on said semiconductor circuit substrate; a first IPD capacitance formed on said semiconductor circuit substrate said first IPD capacitance having an RF input node, corresponding to said conductive RF input pad, and an RF output node;
    an IPD inductance formed on said semiconductor circuit substrate, said IPD inductance being connected in parallel with said first IPD capacitance;
    a second IPD capacitance formed on said semiconductor circuit substrate, said second IPD capacitance being connected to said RF input node; and
    a third IPD capacitance formed on said semiconductor circuit substrate, said third IPD capacitance being connected to said RF output node;
    wherein said conductive RF input pad, said conductive RF output pad, said first IPD capacitance, said IPD inductance, said second IPD capacitance, and said third IPD capacitance are all formed during one semiconductor fabrication process.

2. An RF harmonic filter circuit according to claim 1, said IPD inductance being configured as a loop inductor.

3. An RF harmonic filter circuit according to claim 1, said first IPD capacitance and said IPD inductance forming a second harmonic resonance circuit.

4. An RF harmonic filter circuit according to claim 1, further comprising:
    said second IPD capacitance having a first end connected to said RF input node, and a second end;
    a first inductance element for establishing a ground connection to said second end of said second IPD capacitance;
    said third IPD capacitance having a first end connected to said RF output node, and a second end; and
    a second inductance element for establishing a ground connection to said second end of said third IPD capacitance.

5. An RF harmonic filter circuit according to claim 4, said second IPD capacitance and said first inductance element forming a combined third harmonic resonance and input matching circuit.

6. An RF harmonic filter circuit according to claim 4, said third IPD capacitance and said second inductance element forming a combined fourth harmonic resonance and output matching circuit.

7. An RF harmonic filter circuit according to claim 4, said IPD inductance, said first IPD capacitance, said second IPD capacitance, said third IPD capacitance, said first inductance element, and said second inductance element being configured to provide a filter response that rejects harmonic frequencies corresponding to a pass band of 1.71 GHz to 1.91 GHz.

8. An RF harmonic filter circuit according to claim 1, further comprising:
    said second IPD capacitance having a first end connected to said RF input node, and a second end;
    said third IPD capacitance having a first end connected to said RF output node, and a second end; and
    a second IPD inductance formed on said semiconductor circuit substrate, said second IPD inductance being connected between said second end of said second IPD capacitance and said second end of said third IPD capacitance.

9. An RF harmonic filter circuit according to claim 8, said second IPD inductance being configured as a non-looped conductive trace.

10. An RF harmonic filter circuit according to claim 8, further comprising an inductance element for establishing a ground connection to said second IPD inductance.

11. An RF harmonic filter circuit according to claim 10, said second IPD capacitance, said third IPD capacitance, said second IPD inductance, and said inductance element forming a combined third harmonic resonance, fourth harmonic resonance, input matching, and output matching circuit.

12. An RF harmonic filter circuit according to claim 10, said IPD inductance, said second IPD inductance, said first IPD capacitance, said second IPD capacitance, said third IPD capacitance, and said inductance element being configured to provide a filter response that rejects harmonic frequencies corresponding to a pass band of 824 MHz to 915 MHz.

13. A radio frequency ("RF") harmonic filter circuit fabricated using integrated passive device ("IPD") process technology, said RF harmonic filter circuit comprising:
    a semiconductor circuit substrate;
    a conductive RF input pad formed on said semiconductor circuit substrate;
    a conductive RF output pad formed on said semiconductor circuit substrate;
    a second harmonic resonance circuit formed on said semiconductor circuit substrate and connected between said conductive RF input pad and said conductive RF output pad, said second harmonic resonance circuit comprising an IPD inductance and a first IPD capacitance;
    a combined third harmonic resonance and input matching circuit connected to said conductive RF input pad; and
    a combined fourth harmonic resonance and output matching circuit connected to said conductive RF output pad; wherein
    said conductive RF input pad, said conductive RF output pad, said IPD inductance, and said first IPD capacitance are all formed during the same semiconductor fabrication process.

14. An RF harmonic filter circuit according to claim 13, said combined third harmonic resonance and input matching circuit comprising a second IPD capacitance formed on said semiconductor circuit substrate during the same semiconductor fabrication process, and said combined fourth harmonic resonance and output matching circuit comprising a third IPD capacitance formed on said semiconductor circuit substrate during the same semiconductor fabrication process.

15. An RF harmonic filter circuit according to claim 14, said combined third harmonic resonance and input matching circuit further comprising a first inductance element for establishing a ground connection to said second IPD capacitance; and said combined fourth harmonic resonance and output matching circuit further comprising a second inductance element for establishing a ground connection to said third IPD capacitance.

16. An RF harmonic filter circuit according to claim 13, said second harmonic resonance circuit, said combined third harmonic resonance and input matching circuit, and said combined fourth harmonic resonance and output matching circuit being configured to provide a filter response that rejects harmonic frequencies corresponding to a pass band of 1.71 GHz to 1.91 GHz.

17. A radio frequency ("RF") harmonic filter circuit fabricated using integrated passive device ("IPD") process technology, said RF harmonic filter circuit comprising:

a semiconductor circuit substrate;

a conductive RF input pad formed on said semiconductor circuit substrate;

a conductive RF output pad formed on said semiconductor circuit substrate;

a second harmonic resonance circuit formed on said semiconductor circuit substrate and connected between said conductive RF input pad and said conductive RF output pad, said second harmonic resonance circuit comprising an IPD inductance and a first IPD capacitance; and a combined third harmonic resonance, input matching, and output matching circuit connected between said conductive RF input pad and said conductive RF output pad; wherein said conductive RF input pad, said conductive RF output pad, said IPD inductance, and said first IPD capacitance are all formed during the same semiconductor fabrication process.

18. An RF harmonic filter circuit according to claim 17, said combined third harmonic resonance, input matching, and output matching circuit comprising a second IPD capacitance formed on said substrate during the same semiconductor fabrication process, a third IPD capacitance formed on said substrate during the same semiconductor fabrication process, and a second IPD inductance formed on said substrate during the same semiconductor fabrication process.

19. An RF harmonic filter circuit according to claim 18, said second IPD inductance comprising a conductive trace connected between said second IPD capacitance and said third IPD capacitance.

20. An RF harmonic filter circuit according to claim 18, said combined third harmonic resonance, input matching, and output matching circuit further comprising an inductance element for establishing a ground connection to said third IPD capacitance.

21. An RF harmonic filter circuit according to claim 17, said second harmonic resonance circuit and said combined third harmonic resonance, input matching, and output matching circuit being configured to provide a filter response that rejects harmonic frequencies corresponding to a pass band of 824 MHz to 915 MHz.

22. A radio frequency ("RF") harmonic filter circuit fabricated using integrated passive device ("IPD") process technology, said RF harmonic filter circuit comprising:

a substrate;

a first IPD capacitance formed on said substrate, said first IPD capacitance having an RF input node and an RF output node;

an IPD inductance formed on said substrate, said IPD inductance being connected in parallel with said first IPD capacitance;

a second IPD capacitance formed on said substrate, said second IPD capacitance being connected to said RF input node, and said second IPD capacitance having a first end connected to said RF input node, and a second end;

a third IPD capacitance formed on said substrate, said third IPD capacitance being connected to said RF output node, said third IPD capacitance having a first end connected to said RF output node, and a second end;

a second IPD inductance formed on said substrate, said second IPD inductance being connected between said second end of said second IPD capacitance and said second end of said third IPD capacitance; and an inductance element for establishing a ground connection to said second IPD inductance; wherein said IPD inductance, said second IPD inductance, said first IPD capacitance, said second IPD capacitance, said third IPD capacitance, and said inductance element are configured to provide a filter response that rejects harmonic frequencies corresponding to a pass band of 824 MHz to 915 MHz wherein said IPD inductance, said second IPD capacitance, and said third IPD capacitance are all formed during one semiconductor fabrication process.

* * * * *